United States Patent
Messier et al.

(10) Patent No.: US 11,491,644 B2
(45) Date of Patent: Nov. 8, 2022

(54) ARTICULATED MECHANISM WITH COMPACT TORQUE SENSOR

(71) Applicant: KINOVA INC., Boisbriand (CA)

(72) Inventors: Sebastien Messier, Boisbriand (CA); Louis-Joseph Caron L'Ecuyer, Blainville (CA)

(73) Assignee: KINOVA INC., Boisbriand (CA)

( * ) Notice: Subject to any disclaimer, the term of this patent is extended or adjusted under 35 U.S.C. 154(b) by 307 days.

(21) Appl. No.: 16/570,391

(22) Filed: Sep. 13, 2019

(65) Prior Publication Data

US 2020/0086479 A1 Mar. 19, 2020

Related U.S. Application Data

(60) Provisional application No. 62/730,738, filed on Sep. 13, 2018.

(51) Int. Cl.
| | |
|---|---|
| *B25J 9/10* | (2006.01) |
| *H05K 1/18* | (2006.01) |
| *B25J 17/02* | (2006.01) |
| *B25J 18/00* | (2006.01) |
| *G01L 3/14* | (2006.01) |

(52) U.S. Cl.
CPC .......... *B25J 9/106* (2013.01); *B25J 17/0241* (2013.01); *B25J 18/00* (2013.01); *G01L 3/1457* (2013.01); *H05K 1/189* (2013.01)

(58) Field of Classification Search
CPC ........ B25J 9/106; B25J 17/0241; B25J 18/00; G01L 3/1457; H05K 1/189
See application file for complete search history.

(56) References Cited

U.S. PATENT DOCUMENTS

| | | | | |
|---|---|---|---|---|
| 5,508,781 | A * | 4/1996 | Imai ........................ | G02B 7/08 |
| | | | | 396/529 |
| 8,410,732 | B2 * | 4/2013 | Kassow .............. | B25J 19/0004 |
| | | | | 318/372 |
| 9,078,579 | B2 * | 7/2015 | Gilad ..................... | H05K 1/189 |
| 9,843,851 | B2 * | 12/2017 | Chamberlin ......... | H05K 1/0278 |
| 10,343,277 | B2 * | 7/2019 | Gombert ............... | B25J 9/1617 |
| 10,399,232 | B2 * | 9/2019 | Oestergaard .......... | B25J 9/1674 |
| 10,762,801 | B2 * | 9/2020 | Ciniello ................ | G09B 19/00 |
| 11,027,422 | B2 * | 6/2021 | Ayuzawa ................ | B25J 9/101 |
| 2006/0163939 | A1 * | 7/2006 | Kuramochi .......... | B60T 13/741 |
| | | | | 303/122.04 |

(Continued)

*Primary Examiner* — Zakaria Elahmadi
(74) *Attorney, Agent, or Firm* — Norton Rose Fulbright Canada LLP

(57) ABSTRACT

A motorized joint unit comprises a pair of shells defining an inner cavity, the pair of shells adapted to be connected to adjacent links of an articulated mechanism. A rotor and stator in the inner cavity are actuatable to cause a relative rotation therebetween. A shaft connected to the rotor to rotate with the rotor relative to the stator. A support coupled to the shaft by a mechanism, the support being connected to one of the shells to impart a rotation of the shaft to the shell, the support defining an annular wall. One or more strain gauges are located on said annular wall of the support. A printed circuit board (PCB) is applied against the annular wall and electrically connected to the at least one strain gauge, the PCB adapted to be electrically linked to a controller.

17 Claims, 8 Drawing Sheets

(56) References Cited

U.S. PATENT DOCUMENTS

| | | | | |
|---|---|---|---|---|
| 2010/0174141 | A1* | 7/2010 | Gilad | A61B 1/041 600/118 |
| 2011/0239788 | A1* | 10/2011 | Nagasaka | B25J 13/085 73/862.338 |
| 2011/0314935 | A1* | 12/2011 | Krippner | G01L 3/1457 73/862.045 |
| 2012/0286629 | A1* | 11/2012 | Johnson | B25J 9/08 310/68 B |
| 2014/0207279 | A1* | 7/2014 | Miyauchi | B25J 13/084 700/253 |
| 2017/0292881 | A1* | 10/2017 | Jennings | G01L 5/28 |
| 2018/0281208 | A1* | 10/2018 | Fauteux | H02K 21/22 |
| 2019/0064018 | A1* | 2/2019 | Miyazawa | B25J 19/00 |
| 2020/0324406 | A1* | 10/2020 | Ayuzawa | B25J 9/101 |
| 2021/0131892 | A1* | 5/2021 | Endo | G01L 3/1457 |

* cited by examiner

ARTICULATED MECHANISM WITH COMPACT TORQUE SENSOR

CROSS-REFERENCE TO RELATED APPLICATION

The present application claims the priority of U.S. Patent Ser. No. 62/730,738, filed on Sep. 13, 2018, and incorporated herein by reference.

TECHNICAL FIELD

The present application relates to the field of robotics involving mechanisms such as articulated mechanisms and robot arms and to torque sensors in such articulated mechanisms.

BACKGROUND OF THE ART

Robotic arms are increasingly used in a number of different applications, from manufacturing, to servicing, and assistive robotics, among numerous possibilities. In robotic arms, body members may be interconnected by motorized joints, the body members respectively connected to the stator and the rotor. One non-limitative example thereof is described in U.S. Pat. No. 9,126,332, incorporated by reference.

Torque sensors for articulated robot arms are commercially available as separate units that are added next to the motorized joints. Examples of such torque sensors may be found in U.S. Pat. Nos. 8,671,780 and 8,733,182. The drawback of such torque sensors is that they may add extra components in the articulated robot arm and may not be compact enough for newer lightweight robot arms.

It is also known to add strain gauges on a thin wall section of a motor as disclosed in U.S. Pat. No. 3,920,082. While this approach is fine when only one motor is considered in a device, it may not be practical when multiple motors are installed in a serial manner in an articulated robot arm as the proposed approach does not readily enable power transmission between strain gauges of one motorized joint to another, without restricting the robot arm's joint movement.

Another alternative is disclosed in U.S. Pat. No. 9,097,598 in which power to the strain gauges is supplied from batteries located close to the strain gauges. While this approach might be adequate for some applications, it is not practical in a robot arm that might function continuously for hours. Having a battery at each motorized joint is impractical at battery replacement.

SUMMARY

It is an aim of the present disclosure to provide a mechanism such as a robot arm that addresses issues related to the prior art.

Therefore, in accordance with the present disclosure, there is provided a motorized joint unit comprising: a pair of shells defining an inner cavity, the pair of shells adapted to be connected to adjacent links of an articulated mechanism; a rotor and stator in the inner cavity actuatable to cause a relative rotation therebetween; a shaft connected to the rotor to rotate with the rotor relative to the stator; a support coupled to the shaft by a mechanism, the support being connected to one of the shells to impart a rotation of the shaft to the shell, the support defining an annular wall; at least one strain gauge located on said annular wall of the support; a printed circuit board (PCB) applied against the annular wall and electrically connected to the at least one strain gauge, the PCB adapted to be electrically linked to a controller.

DETAILED DESCRIPTION

Figure 1:
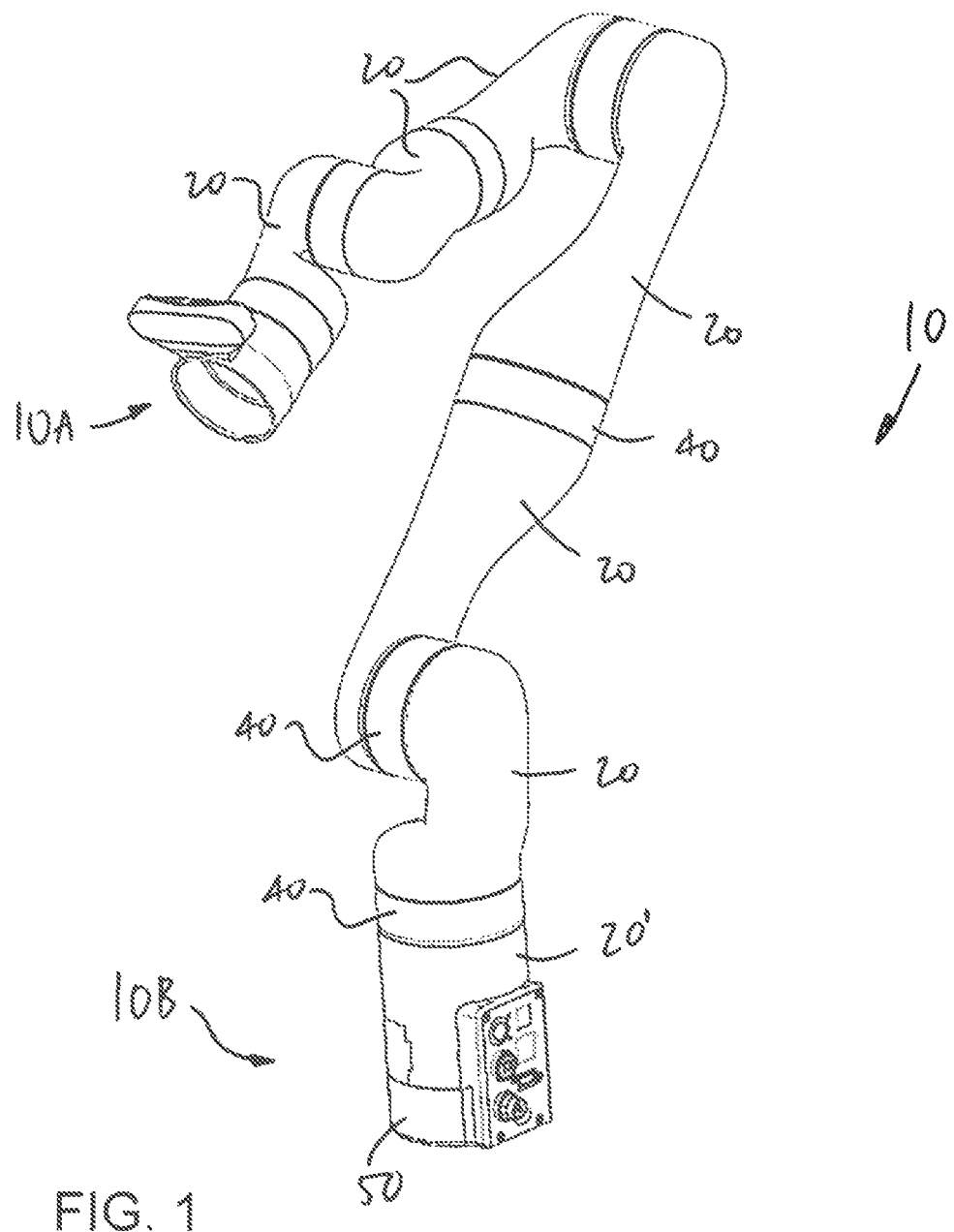
FIG. 1 is an isometric view of an articulated robot arm in accordance with an embodiment of the present disclosure.

Referring to the drawings and more particularly to FIG. 1, a mechanism such as robot arm in accordance with the present disclosure is generally shown at 10, and is also referred to as an articulated robotic arm or robotic arm, etc. Although the compact torque sensor and motorized joint unit described herein are shown on the robot arm 10, they may be used with other mechanisms, such as articulated mechanisms or arms, serial mechanisms or arms, parallel mechanisms or arms, or like mechanisms or arms. However, for simplicity, the expression "robot arm" is used throughout, but in a non-limiting manner. The robot arm 10 is a serial articulated robot arm, having an effector end 10A and a base end 10B. The effector end 10A is configured to receive any appropriate tool, such as gripping mechanism or gripper, anamorphic hand, tooling heads such as drills, saws, an instrument drive mechanism, etc. The end effector secured to the effector end 10A is as a function of the contemplated use. However, the robot arm 10 is shown without any such tool in FIG. 1, a motorized joint unit being shown instead, and ready for supporting a tool. The motorized joint unit is tasked with driving the end effector, and may have other names, such as a gearmotor, a motor, an actuator, etc. The base end 10B is configured to be connected to any appropriate structure or mechanism. The base end 10B may be rotatably mounted or not to the structure or mechanism. By way of a non-exhaustive example, the base end 10B may be mounted to a wheelchair, to a vehicle, to a frame, to a cart, to a robot docking station. Although a serial robot arm is shown, the joint arrangement of the robot arm 10 may be found in other types of robots, included parallel manipulators.

The robot arm 10 has a series of links 20 (also known as shells), interconnected by motorized joint units 30 (shown starting at FIG. 2), for example with protective sleeves 40 at the junction between adjacent links 20. A bottom one of the links 20 is shown and referred to herein as a robot arm base link 20', or simply base link 20', and may or may not be releasably connected to a docking cradle 50.

The links 20 define the majority of the outer surface of the robot arm 10. The links 20 also have a structural function in that they form the skeleton of the robot arm 10 (i.e., an outer shell skeleton), by supporting the motorized joint units 30 and tools at the effector end 10A, with loads supported by the tools, in addition to supporting the weight of the robot arm 10 itself. Wires and electronic components may be concealed into the links 20, by internal routing.

The motorized joint units 30 interconnect adjacent links 20, in such a way that a rotational degree of actuation is provided between adjacent links 20. According to an embodiment, the motorized joint units 30 may also connect a link to a tool at the effector end 10A, although other mechanisms may be used at the effector end 10A and at the base end 10B. The motorized joint units 30 may also form part of structure of the robot arm 10, as they interconnect adjacent links 20. Compact torque sensors of the present disclosure are integrated into the motorized joint units 30.

The sleeves 40 shield the junction between pairs of adjacent links 20. The sleeves 40 may form a continuous fastener-less surface from one link 20 to another.

The docking cradle 50 may be present and is part of the structure or mechanism to which the robot arm 10 is to be releasably connected. For example, the docking cradle 30 may be on a workstation, bench, table, wheeled support, floor, etc. The docking cradle 50 may have other names, such as robot arm base, dock, anchor, docking station, etc. For simplicity, the expression docking cradle will be used herein. The base link 20' of one robot arm 10 may be used with numerous docking cradle 30, when the robot arm 10 is transferred from one location to another. Likewise, the base links 20' of multiple robot arms 10 may be used with one or more docking cradle 50, for instance, by interchanging robot arms 10 on a docking cradle 50 as a function of the tools supported by the robot arms 10.

Figure 6:
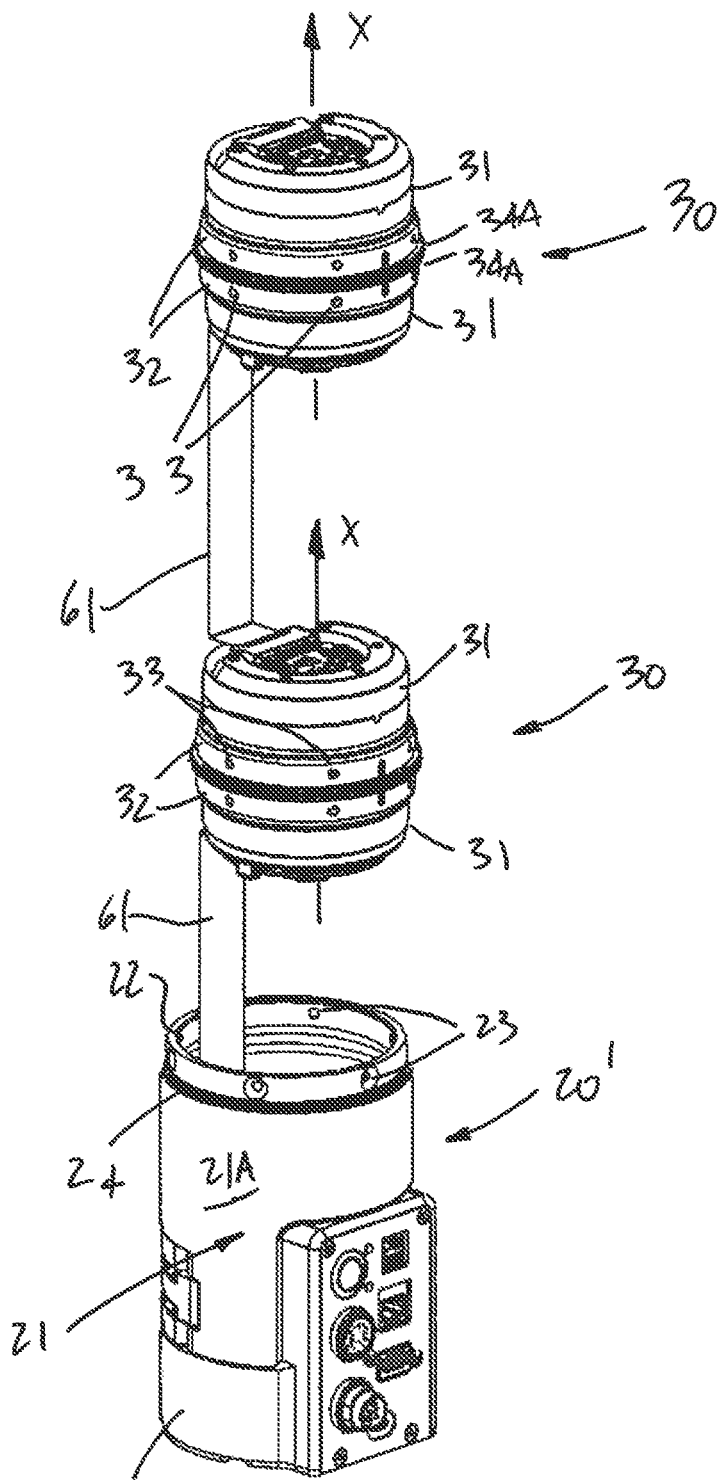
FIG. 6 is an isometric exploded view showing a serial interconnection of the motorized joint units of FIG. 2.
Figure 7:
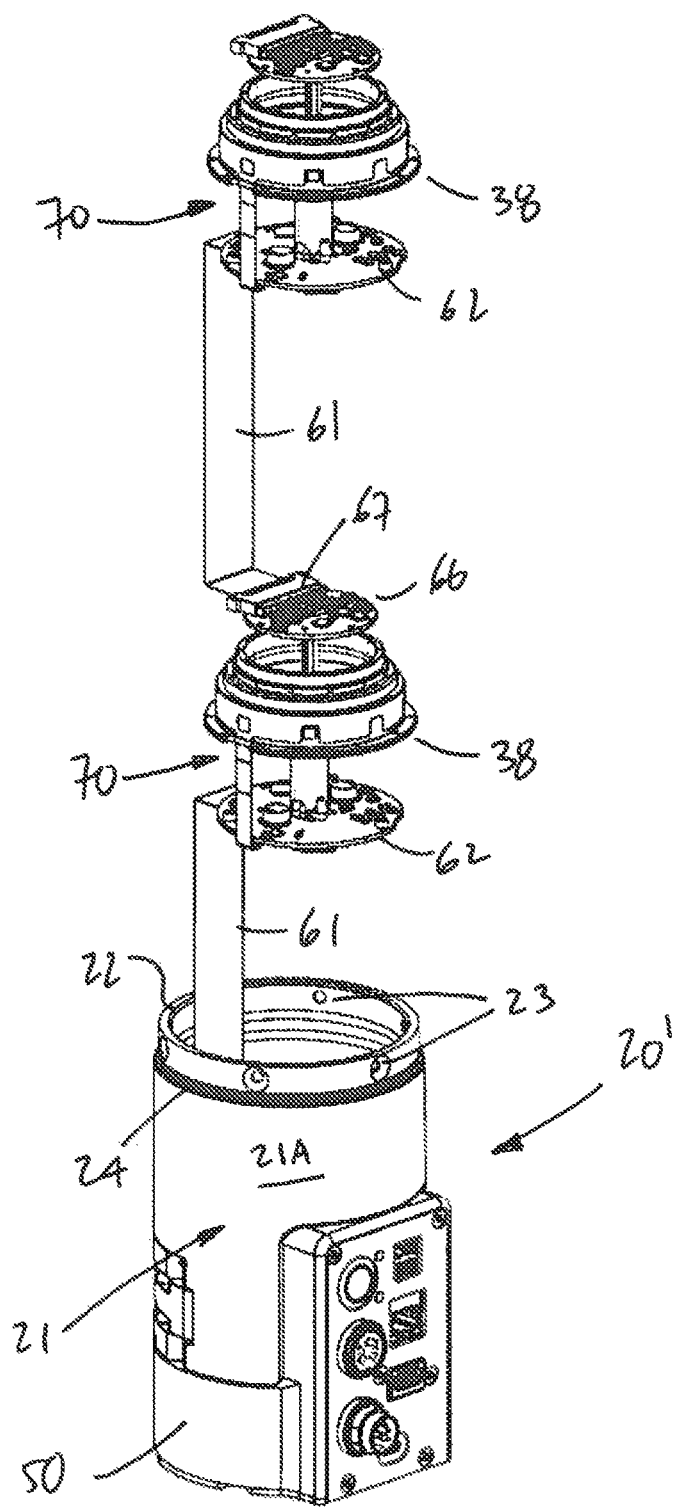
FIG. 7 is an isometric exploded view of a serial interconnection of the assemblies of FIG. 4.

Referring to FIGS. 6 and 7, the base link 20' is shown in greater detail, and has features similar to the other links 20. The expression "link" is used herein to describe a rigid member, without in and of itself any degree of freedom between its ends. A link may be connected to another link by a joint, such as one of the motorized joint units 30. However, to avoid redundancy, only the base link 20' is described in further detail herein. The links 20 each have a tubular body 21. An outer peripheral surface 21A of the tubular body 21 forms the exposed surface of the links 20,20'. The tubular body 21 may differ in length, in diametrical dimension, and in shape. For example, as shown in FIG. 1, some of the links 20,20' may be generally straight or angled, i.e., arranged such that the rotation angles of the motorized joint units 30 at their opposed ends are parallel, perpendicular, or at any other angle. Some links 20,20' may be longer, etc. Also, the open ends of the links 20,20' may have the same diameter for all motorized joint units 30 to be the same size, it is contemplated to scale down the motorized joint units 30 from the proximal base end 10B to the distal effector end 10A to reduce the overall weight of the robot arm 10. In such a case, the diameter of the open ends of the links 20 may incrementally reduce toward the distal end. The tubular body 21 of the links 20,20' may consist of any appropriate material, including composites, plastics, metals, or any combination thereof. The tubular body 21 may be monolithic pieces, or an assembly of components, and may be molded, extruded, machines, etc.

The top open end of the tubular body 21 may have a connector 22. Other arrangements are possible as well, including the absence of such connectors 22. The connector 22 may be an integral part of the tubular body 21, e.g., monoblock, or may be an added ring, for example. The connector 22 may be annular in shape, with a circular section. The connector 22 may form a neck from the main outer peripheral surface 21A of the tubular body 21. Stated differently, a step is present from the main outer peripheral surface 21A to the connector 22, due to a larger diameter of the tubular bodies 21 at the main outer peripheral surface 21A immediately adjacent to the connector 22, for receiving the protective sleeve 40 thereon. The connector 22 may have circumferentially distributed holes 23, such as counterbored holes and/or countersink holes, for receiving fasteners (e.g., bolts, screws, etc) to fasten the motorized joint units 30 to the links 20,20'. The holes 23 may be equidistantly spaced, or have a particular sequence, etc.

An annular channel 24 may be defined in the connector 22. The annular channel 24 is devised to receive therein an annular seal, or part of the protective sleeve 40. There may be no annular channel 24, or more than one. The annular seal, if any, may be any appropriate type of seal, such as O-ring, X-shaped ring, square-section ring, to seal an annular junction between the connector 22 and the sleeve 40. The annular seal, if any, is made of an elastomer selected as a function of the contemplated use of the robot arm 10. For example, the selection of the annular seal may depend on the temperatures to which the robot arm 10 will be subjected, the fluids that may contact the robot arm 10, etc.

Figure 2:
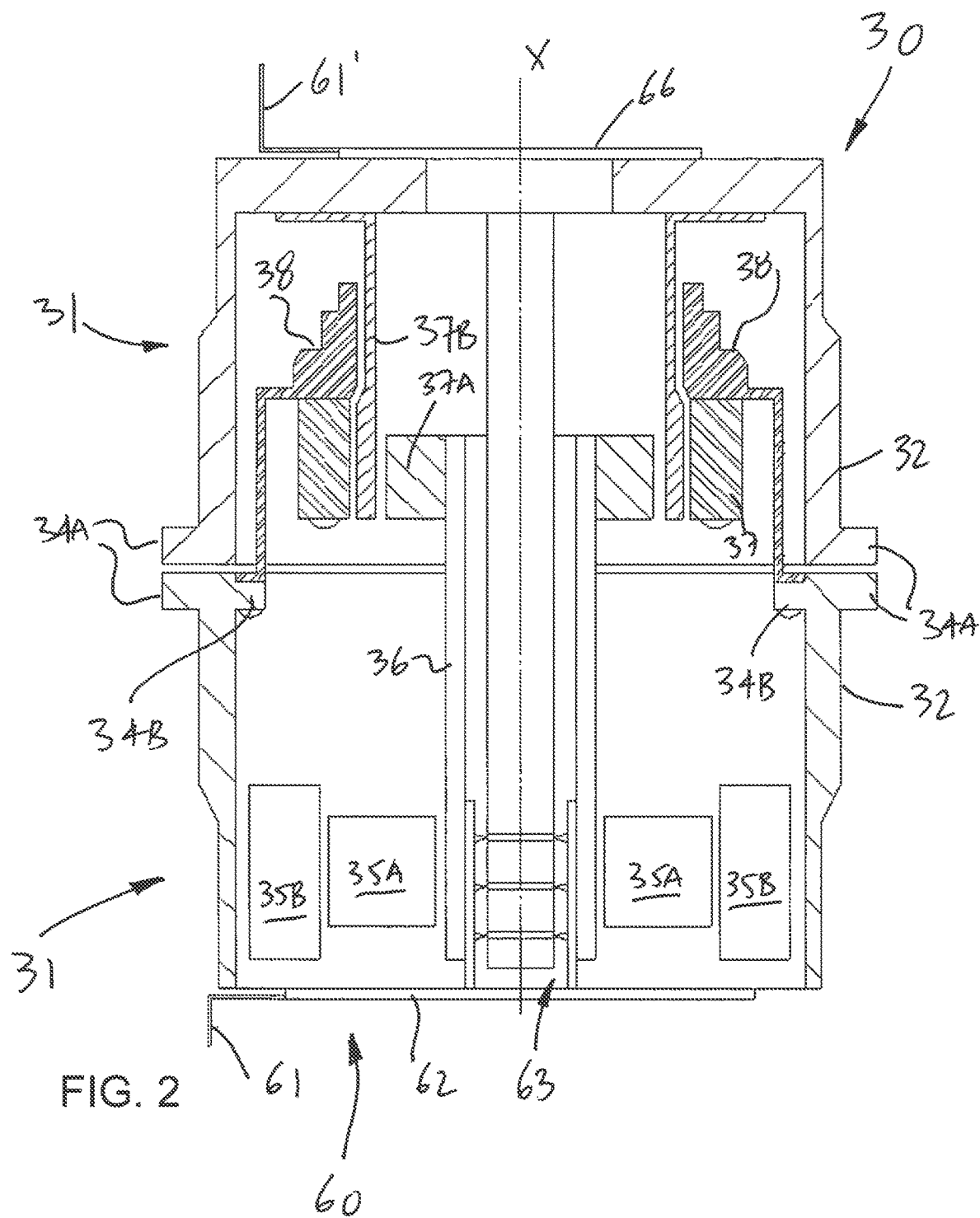
FIG. 2 is a schematic sectional view of a motorized joint unit with used at joints of the articulated robot arm of FIG. 1, of the type employing a compact torque sensor unit in accordance with the present disclosure.

Referring to FIGS. 2 and 6, the motorized joint units 30 are shown. Each of the motorized joint unit 30 is of the type having two casing shells 31, rotatable relative to one another along rotational axis X, as a response to actuation from the motorization components inside the motorized joint unit 30. Therefore, the two casing shells 31 are separated by a rotation plane, to which a vector of the rotational axis X is normal. The casing shells 31 are separated into a motor side, housing the motor, and a gear side. In some embodiments, the casing shell 31 housing the motor side is fixed while the casing shell 31 of the gear side is rotatable. A reverse configuration is possible, e.g. the shell 31 of the gear side is fixed while the shell 31 of the motor side is rotatable. Therefore, the following description covers both embodiments.

Each of the casing shells 31 of the motorized joint unit 30 may have an annular connector surface 32 in which fastener bores are circumferentially distributed, to match the distribution of connection holes 23 in the connector 22. The annular connector surface 32 may be substantially cylindrical. The fastener bores 33 may be of different sizes or of a same size, and may be equidistantly circumferentially distributed, or distributed with a given non-uniform spacing sequence. The fastener bores 33 emulate a sequence of connection bores 23 in the connectors 22, if there is such a sequence of connection bores (as opposed to having a unique connection bore format with equidistant circumferential spacing). Different types of fasteners may be used, such as set screws may be used for greater positional accuracy, while normal screws may be concurrently used for strength, etc. Any irregular sequence as described above may be used to ensure that the motorized joint unit 30 is installed in a desired orientation in the links 20.

Outer end flanges 34A may be at an end of the annular connector surfaces 32, and may assist in keeping the motorized joint units 30 axially aligned at the end of the tubular bodies 21, by forming a stop against axial displacement of the connectors 22. Inner flanges 34B may also be present, for connection of inner components of the motorized joint unit 30 to the casing shell 31. This may prevent the motorized joint units 30 from being swallowed by the tubular bodies 21 during assembly, for example. The rotation plane of the motorized joint unit 30 may lie between the end flanges 34A. When a pair of the links 20 is assembled end to end with a motorized joint unit 30 between them, the assembly is compact and robust. In particular, the connectors 22 may come into contact with the respective end flanges 34A of the motorized joint unit 30. The sleeves 40 may then cover the connectors 22 of adjacent links 20, in the manner shown in FIG. 1.

Referring to FIG. 2, a schematic sectional view of one of the motorized joint units 30 is shown. The sectional view is schematic in that numerous components may have been removed for the simplicity of the figure. Additional components may be present, such as fasteners, bearings, a brake system, etc, for example as exemplified by U.S. patent application Ser. No. 15/475,775, incorporated herein by reference, by the present Applicant. The motorized joint unit 30 has motorization, for instance in the form of a rotor 35A and a stator 35B, causing a relative rotational movement between one another, by the presence of electromagnetic actuation. This is one possible arrangement among others. The rotor 35A is connected to a shaft 36 that is coupled to an output gear 37 by any appropriate manner.

For example, in FIG. 2, a strain wave gear system is shown as a non-limitative example only. However, other examples may be used for the transmission of the torque from the shaft 36 to the gear-side shell 31. For example, a planetary gear system, or like reduction gear box could be present. The shaft 36 could also be coupled directly to the output gear 37 for instance by spline connection, and in such a case the output gear 37 could be connected to the gear-side shell 31 by an output gear support 38 described below.

In the case of the strain wave gear system, a wave generator 37A is on the shaft 36, and a flexible gear 37B (e.g., flexible spline) is coupled to the gear-side shell 31, and is sandwiched between the wave generator 37A and the output gear 37 (e.g., output spline). The wave generator 37A may have an elliptical or oval outer surface for contacting the interior surface of the flexible gear 37B, and hence engage with the output gear 37 at wider portions of the wave generator 37A/flexible gear 37B assembly. Accordingly, the wave generator 37A transmits its rotation to the output gear 37 through deformation of the flexible gear 37B which remains otherwise fixed in rotation. The strain wave gear system operates with the strain wave gear principle. A torque can be measured on the output gear support 38 discussed below if strain gauges are adequately positioned. Because of the speed reduction provided by the strain wave gear principle, measurement of the torque on the output gear support 38 may assist in operating the robotic arm 10.

Figure 3A:
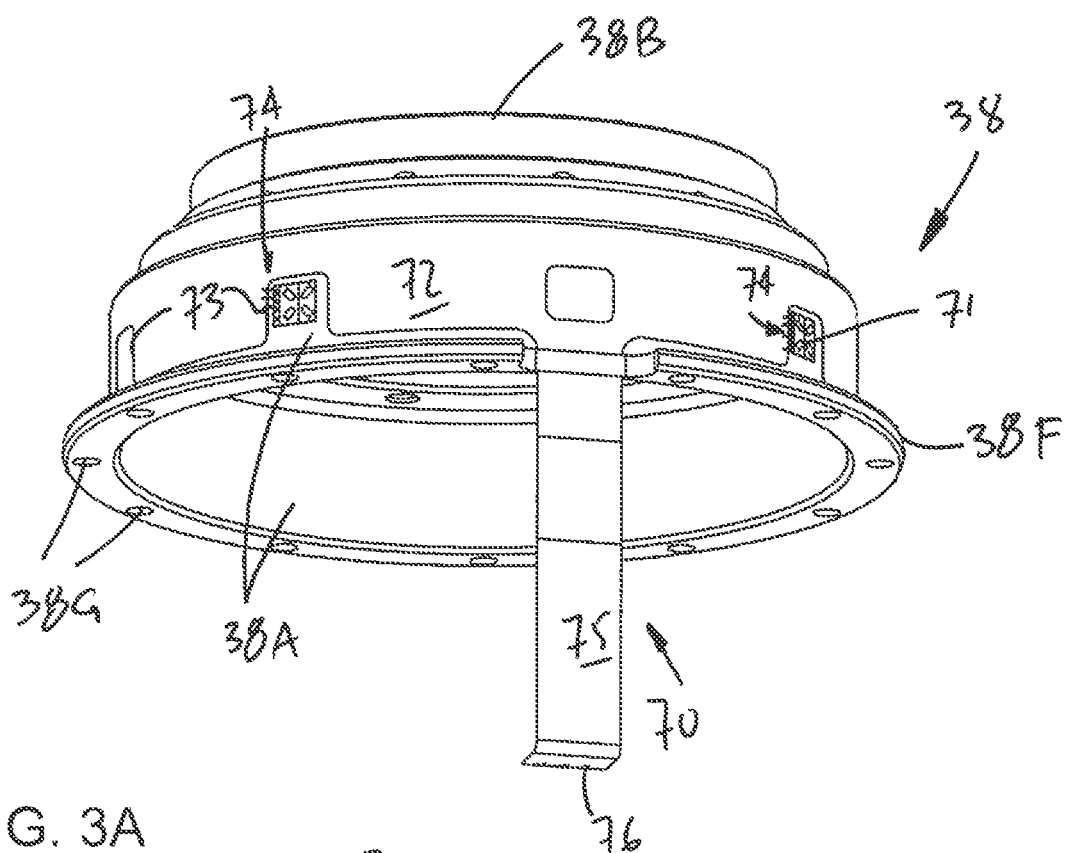
FIG. 3A is an isometric view of an output gear support of the motorized joint unit of FIG. 2, with the torque sensor unit of the present disclosure on an outer surface thereof.
Figure 3B:
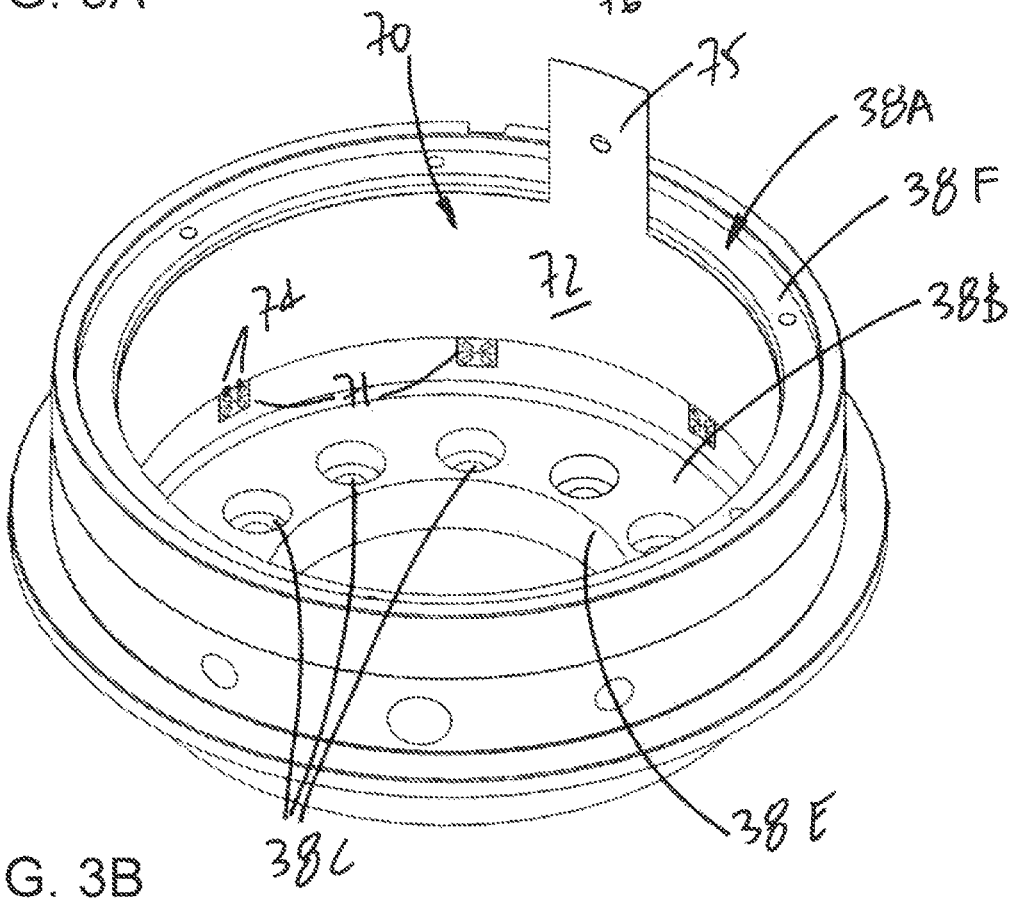
FIG. 3B is an isometric view of the output gear support with the torque sensor unit of the present disclosure on an inner surface thereof.

The output gear 37 is connected to one of the shells 31 by way of an output gear support 38, also simply referred to as support 38. Therefore, the support 38 has a structural function, as it transmits the torque of the shaft 36 to one of the shells 31, for rotation. Referring concurrently to FIGS. 2, 3A and 3B, the support 38 is shown in greater details, and the following description will refer to components of the support 38 by using reference numeral 38 affixed with letters, e.g., 38A, to identify components of the support 38. The support 38 has a tubular body defined by a wall 38A. The wall 38A may have a generally cylindrical shape, or other suitable shape, and may hence define an inner cavity—it may be regarded as a receptacle, etc. An end member 38B (in an example a disk wall) may be located at an end of the wall 38A. The end member 38B may be coupled to the output gear 37, so as to form an integral rotatable component. The output gear 37 may hence be interiorly received in the inner cavity of the wall 38A, with its teeth or splines facing radially inwardly. Accordingly, fastening bores 38C may be circumferentially distributed in the end member 38B for fasteners to secure the output gear 37 to the support 38, or for connection of other components (e.g., a ring gear of a planetary gear system for example). Other fixing techniques may also be considered, including welding, 3D printing, machining of a monoblock piece integrating the output gear 37 to the support 38, among other examples. Alternatively, the output gear 37 may be secured directly to the wall 38A. A central opening 38E may be present in the end member 38B, for the shaft 36 to pass through it.

A flange 38F may be provided at the other end of the wall 38A, for coupling with one of the casing shells 31, in the manner shown in FIG. 2. The flange 38F may consequently have fastener holes 38G, emulating a sequence of bores in the inner flange 34B of the casing shell 31. As an alternative embodiment, the wall 38A could have fastener bores for radially oriented fasteners or tabs, or the wall 38A could abut against the outer end flanges 34A, among other possibilities (e.g., a splined engagement).

In order to have the electrical power and control signals to feed the motorized joint units 30, going from a power supply (not shown) located for example in the docking cradle 50, if present, or on the structure or mechanism support the robot arm 10, an electrical system 60 is provided in the robot arm 10. Referring to FIGS. 2 and 4-7, the electrical system 60 may have a cable 61, (e.g., a flexible cable). The expression "cable" is used to include one or more cables, such a bundle of cables/wires, a harness of cables/wires, cables/wires of different types, optical fiber(s), etc. The cable 61 is connected to a power and signals source to transmit power and control signals. The source may be the controller embedded at the base of robot arm 10, if the motorized joint unit 30 is the one at the base link 20'. The source may be the upstream motorized joint unit 30 in a serial arrangement of motorized joint units 30, as in the robot arm 10 of FIG. 1, upstream meaning in a direction of the base link 20'. The cable 61, for instance in the form of a ribbon (as shown) or harness, may be connected to a printed circuit board (PCB) 62. For example, the cable 61 may have a connector 61A (FIG. 5) by which it may be connected to a complementary plug 62A on the PCB 62, or vice versa, though the cable 61 may be connected directly to the PCB 62. The PCB 62 is equipped to operate the rotation of the rotor 35A relative to the stator 35B, and accordingly supports all appropriate components, circuitry, chips, sensors and wires to control with precision the relative rotation of the rotor 35A relative to the stator 35B.

In order to serially connect the motorized joint units 30 to one another, the electrical system 60 may have an assembly 63 of brushes and slip rings for transmission of power and signals through the rotational joint, with brushes contacting the slip rings in conventional manner. Wires may connect the main board PCB 62 to brushes of the assembly 63. Wires 65 (shown in FIG. 4) extend from the slip rings of the assembly 63 and extend through the shaft 36 to reach a rear adaptor PCB 66. The PCB 66 is secured to the other shell 31. A downstream motorized joint unit 30 may then be connected to the PCB 66 via its cable 61, shown as 61' in FIG. 4. For example, any appropriate connector 67 (FIG. 4) or plug may be provided at the end of the cable 61 for being releasably connected to a complementary plug or connector on the PCB 66.

Figure 4:
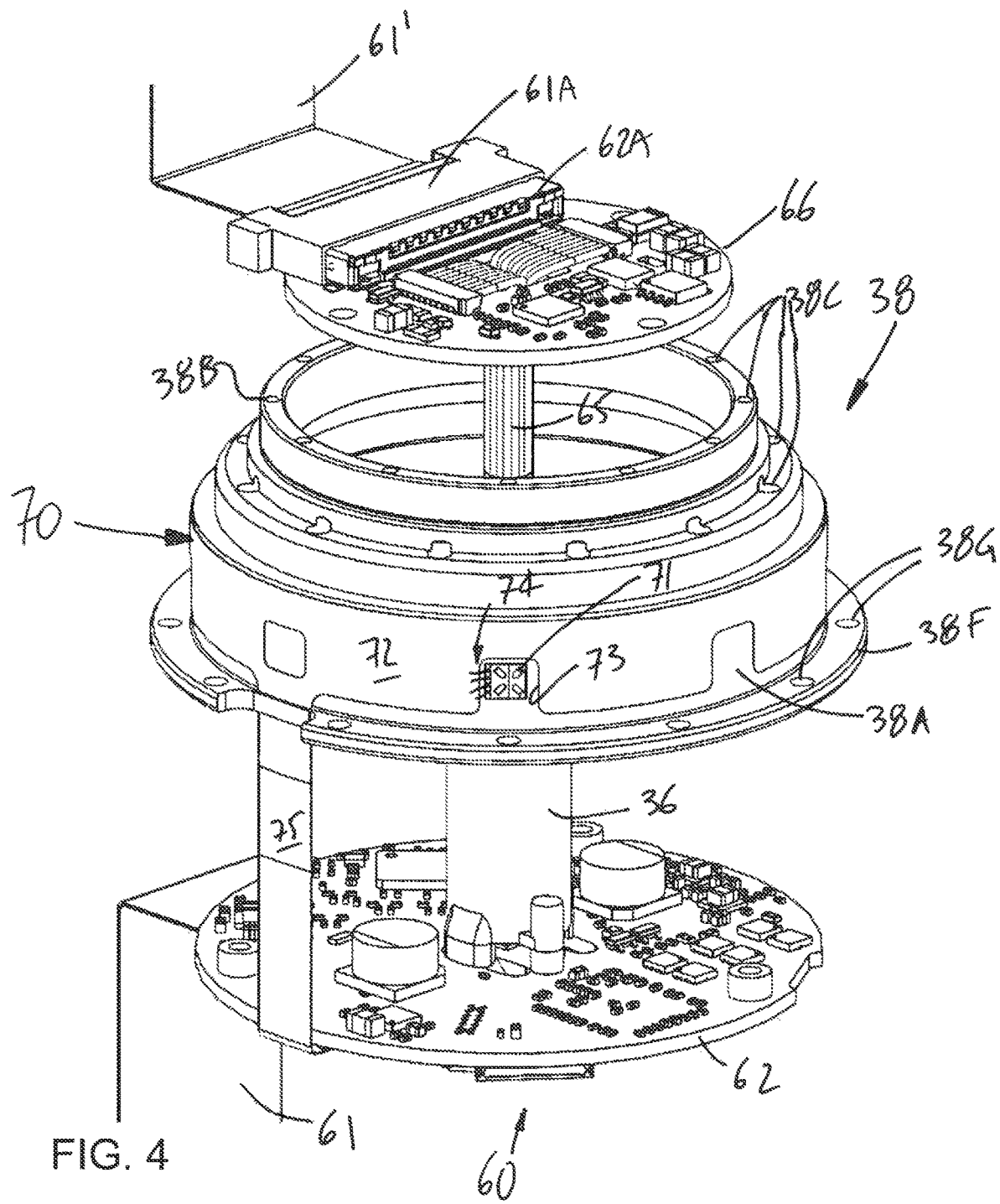
FIG. 4 is a topside isometric view of the output gear support of the motorized joint unit of FIG. 2, with the torque sensor unit and with an electrical system of the motorization unit.

Alternatively, the cable 61 may be soldered directly to the PCB 66, through the male/female pair shown in FIG. 4 may be convenient in terms of modularity. Accordingly, cable 61 is linked to the rear adaptor PCB 66 on one end and to the main board PCB 62 of the next motorized joint unit 30 at its the other end, thus bringing the electrical power and controls signals to the next motorized joint unit 30. This serial approach may be used for every motorized joint unit 30 located at each joint of the robot arm 10, thus providing power and control signals to all motorized joint units 30 in the robot arm 10. Alternative arrangements of the electrical system 60 are contemplated, including ones with no PCBs or a single one of the PCBs (e.g., 62) at the motorized joint units 30. For example, the controller at the base link 20' or structure may provide all control signals and drive the various motorized joint units 30 without the need of local PCBs.

Figure 5:
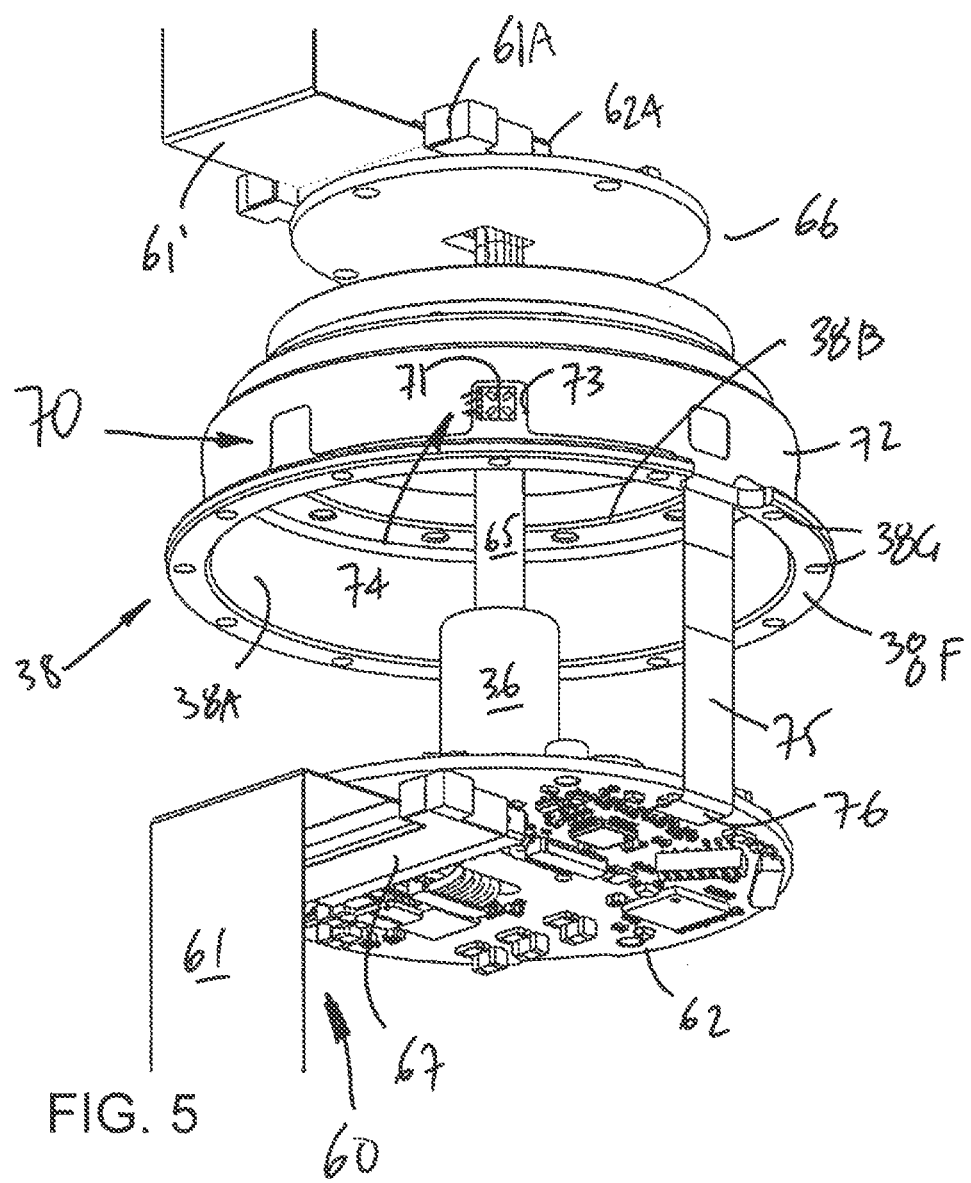
FIG. 5 is an underside isometric view of the output gear support of the motorized joint unit of FIG. 2, with the torque sensor unit and with an electrical system of the motorization unit.

Referring to FIGS. 3A, 3B, 4, 5 and 7, the torque sensor of the present disclosure is generally shown at 70, with its components being labelled from 71-79. There may be a torque sensor unit 70 at each of the motorized joint units 30, or at a single one of the motorized joint units 30, etc. The torque sensor unit 70 has one or more strain gauges 71, mounted to the wall 38A of the support 38, for instace circumferential spaced apart. The strain gauge(s) 71 are one type of sensor among others that may be used at 71. The strain gauge(s) 71 is bonded to the outside surface of the wall 38A of the support 38 as in FIG. 3A, or to the inside surface of the wall 38A as in FIG. 3B. FIGS. 4, 5 and 7 show the torque sensor unit 70 being on the outside surface of the wall 38A, but could also have the arrangement of FIG. 3B with the torque sensor unit 70 on the inner surface of the wall 38A. An PCB 72 of arcuate shape, for example as a result of being flexible or rigid, is installed around the outside surface of the wall 38A (or on the inner surface). In the case of a flexible PCB, the flexibility may be defined by the capability of the PCB to deform in an elastic deformation range to the shape shown in the figures. In an embodiment, the main faces of the PCB 72 are arcuate, i.e., they are not planar. A PCB could also be printed directly on wall 38A. The PCB 72 may define one or more openings 73 or like clearances, the opening(s) 73 being aligned to be in register with the strain gauge(s) 71, for instance in a one-to-one arrangement (one opening 73 dedicated to one strain gauge 71). A contact(s) 74 such as micro wire(s) or bead is connected (e.g., welded, soldered) between the contact pads of the strain gauge(s) 71 and the contact pads of the PCB 72 to provide the required electrical connection between the strain gauge(s) 71 and the PCB 72. The PCB 72 may then extend to the PCB 62 as shown by PCB strip 75 or equivalent wire(s). The PCB 72 may have an elongated body, with the PCB strip 75 integral with the elongated body in an embodiment. An end connector 76 is then linked to the PCB 62 (e.g., FIG. 4, received in a complementary plug or vice versa), whereby electrical power is supplied to the strain gauge(s) 71 to enable torque measurements on the wall 38A of the support 38. The PCB 72 may be wired directly to the PCB 62 as well. Part of the electrical power supplied to the PCB 62 is used by the components of the PCB 62, while another part is sent to the PCB 72, for example through the end connector 76 if present. As the PCB 72 is energized, it brings the needed electrical power to strain gauge(s) 71 through the contact(s) 74. The return signal of the strain gauge(s) 71 may then go through the PCB 72 and then to the PCB 62 for signal processing and a determination of the torque in the motorized joint unit 30.

The use of PCB 72, for instance in a flexible configuration adopting an arcuate shape as in the figures, to electrically link the strain gauge(s) 71 may simplify the assembly of the torque sensor unit 70 on the motorized joint unit 30. Another alternative would be to weld multiple wires to electrically link the strain gauge(s) 71 to another PCB, such as the PCB 62. If the number of strain gauges 71 is increased, the number of wires to be welded is also multiplied as each strain gauge 71 may need from 2 to 5 wires, whereby the assembly is simplified by the use of a PCB 72 to interface the strain gauge(s) to the PCB 62 or to the controller.

FIG. 6 is an isometric view of an interior of the robot arm 10, with the links 20 removed illustrating how the motorized joint units 30 may be serially linked to enable electrical power and signals to service the motor of the next motorized joint unit 30. While only two motorized joint units 30 are shown in FIG. 6, the serial interconnection between motorized joint units 30 may extrapolated to all motorized joint units 30 of the robot arm 10. FIG. 7 shows a serial interconnection of the electrical systems 60 and torque sensor units 70 relative to the output gear support.

Figure 8:
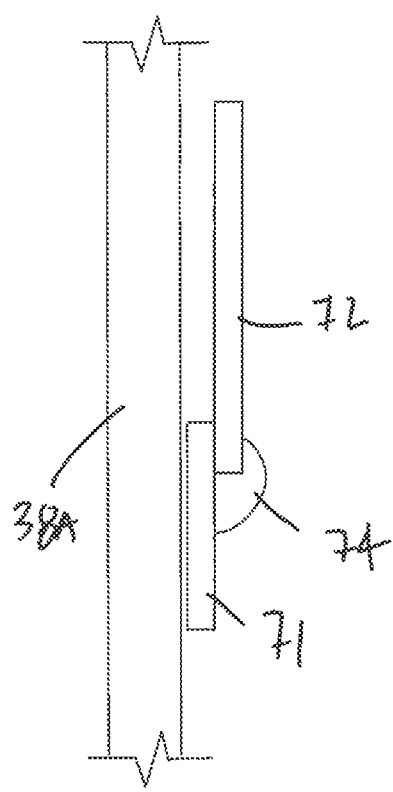
FIG. 8 is a schematic view of an interconnected of a printed circuit board to a strain gauge in an embodiment of the torque sensor unit of the present disclosure.

FIG. 8 present a schematic enlarged side view of how the various components of the torque sensor unit 70 are positioned relative to one another, according to an embodiment, such as the torque sensor unit 70 on the inner surface of the wall 38A as in FIG. 3B, in which the PCB 72 may partially overlap the strain gauge 71. The contact 74, in the form of a bead as an alternative to a micro wire, links electrically the strain gauge 71 to the PCB 72.

If the robot arm 10 is an assistive robot arm used by handicapped or physically challenged people, the torque sensor unit(s) 70 may be used for safety reasons so as not to injure the user with the robot arm 10. The torque sensor unit(s) 70 may also be used for collision detection, to stop the robot arm 10 as it impacts any object while in motion. Torque sensing may also be necessary for hand guided programming. The torque sensor unit(s) 70 may also protect the robot arm 10 when a user attempts to lift objects heavier that the specifications of the robot arm 10.

The invention claimed is:

1. A motorized joint unit comprising:
   a pair of shells defining an inner cavity, the pair of shells adapted to be connected to adjacent links of an articulated mechanism;
   a rotor and stator in the inner cavity actuatable to cause a relative rotation therebetween;
   a shaft connected to the rotor to rotate with the rotor relative to the stator;
   a support coupled to the shaft by a mechanism, the support being connected to one of the shells to impart a rotation of the shaft to the shell, the support defining an annular wall;
   at least one strain gauge located on said annular wall of the support;
   a printed circuit board (PCB) applied against the annular wall and electrically connected to the at least one strain gauge, the PCB adapted to be electrically linked to a controller.

2. The motorized joint unit according to claim 1, wherein a plurality of the strain gauges are connected to the PCB.

3. The motorized joint unit according to claim 2, wherein the strain gauges are circumferentially spaced apart on the annular wall.

4. The motorized joint unit according to claim 1, wherein the PCB is a flexible PCB.

5. The motorized joint unit according to claim 1, wherein main faces of the PCB are arcuate.

6. The motorized joint unit according to claim 1, wherein the strain gauges are on an outer surface of the annular wall.

7. The motorized joint unit according to claim 1, wherein the PCB has an elongated shape with at least one cutout opposite the at least one strain gauge.

8. The motorized joint unit according to claim 1, wherein the mechanism includes an output gear integrally connected to the support.

9. The motorized joint unit according to claim 8, wherein the output gear is in an interior cavity defined by the annular wall of the support.

10. The motorized joint unit according to claim 9, wherein the output gear is connected to a disk wall at an end of the annular wall of the support.

11. The motorized joint unit according to claim 8, wherein the mechanism is a strain wave gear system include a wave generator connected to the shaft, a flexible gear operatively connected to the wave generator and fixed to one of the shells, with the output gear connected to the other of the shells.

12. The motorized joint unit according to claim 1, wherein a connection between the at least one strain gauge and the PCB is done with welded micro-wires.

13. The motorized joint unit according to claim 1, wherein a connection between the at least one strain gauge and the PCB is done with beads.

14. The motorized joint unit according to claim 1, further comprising a main PCB rotatably connected to the shaft, the main PCB connected to the PCB.

15. The motorized joint unit according to claim 14, wherein the main PCB is connected to the PCB by a PCB strip.

16. The motorized joint unit according to claim 15, wherein the PCB and the PCB strip are integral to one another.

17. The motorized joint unit according to claim 14, wherein the shaft is hollow, and including another shaft in the shaft, a slip ring arrangement between the main PCT and the other shaft, and an electrical connection between the other shaft and another motorized joint unit.

* * * * *